(12) United States Patent
Jeong et al.

(10) Patent No.: US 10,607,694 B2
(45) Date of Patent: Mar. 31, 2020

(54) MEMORY SYSTEM INCLUDING MEMORY DEVICE AND MEMORY CONTROLLER, AND OPERATION METHOD THEREOF

(71) Applicant: SK hynix Inc., Gyeonggi-do (KR)

(72) Inventors: Seung-Gyu Jeong, Gyeonggi-do (KR); Won-Gyu Shin, Seoul (KR); Jung-Hyun Kwon, Seoul (KR); Do-Sun Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/124,882

(22) Filed: Sep. 7, 2018

(65) Prior Publication Data
US 2019/0189204 A1  Jun. 20, 2019

(30) Foreign Application Priority Data
Dec. 20, 2017  (KR) .................. 10-2017-0176217

(51) Int. Cl.
| G11C 11/00 | (2006.01) |
| G11C 13/00 | (2006.01) |
| G11C 29/00 | (2006.01) |
| G11C 29/52 | (2006.01) |
| G11C 29/44 | (2006.01) |
| G11C 29/04 | (2006.01) |
| G11C 29/42 | (2006.01) |

(52) U.S. Cl.
CPC ...... *G11C 13/0004* (2013.01); *G11C 13/0023* (2013.01); *G11C 13/0035* (2013.01); *G11C 13/0069* (2013.01); *G11C 29/4401* (2013.01); *G11C 29/52* (2013.01); *G11C 29/765* (2013.01); *G11C 29/808* (2013.01); *G11C 29/42* (2013.01); *G11C 2029/0409* (2013.01); *G11C 2029/0411* (2013.01)

(58) Field of Classification Search
CPC . G11C 13/0035; G11C 11/16; G11C 11/5685; G11C 13/0007; G11C 13/004; G11C 2013/0054; G11C 2211/5644; G11C 29/06; G11C 29/36; G11C 13/0004; G11C 13/0069
USPC ........... 375/240.25, 240.26, E7.027, E7.103, 375/E7.17, E7.18, E7.211; 714/758, 714/E11.03, 720, 733; 365/185.33, 200, 365/201, 225.7
See application file for complete search history.

(56) References Cited

U.S. PATENT DOCUMENTS

2013/0046941 A1* 2/2013 Ma ...................... G06F 11/1004
                                                          711/155
2013/0166827 A1   6/2013 Cideciyan et al.

* cited by examiner

*Primary Examiner* — Thong Q Le
(74) *Attorney, Agent, or Firm* — IP & T Group LLP

(57) ABSTRACT

A memory system includes a memory device comprising first to Nth memory regions, wherein N is a natural number equal to or more than 2, and a memory controller suitable for checking numbers of first logic level data which are contained in first to Nth data groups to be written to the memory device, respectively, and writing the first to Nth data groups to the first to Nth memory regions in order based on the checked numbers.

23 Claims, 6 Drawing Sheets

MEMORY SYSTEM INCLUDING MEMORY DEVICE AND MEMORY CONTROLLER, AND OPERATION METHOD THEREOF

CROSS-REFERENCE TO RELATED APPLICATION

This application claims priority under 35 U.S.C. § 119 to Korean Patent Application No. 10-2017-0176217 filed on Dec. 20, 2017, which is incorporated herein by reference in its entirety.

BACKGROUND

1. Field

Exemplary embodiments relate to a memory system, and more particularly, to a memory system which writes data to a memory device including a plurality of memory regions and an operation method thereof.

2. Discussion of the Related Art

A memory system works as a main memory device or auxiliary memory device in various electronic devices for consumers or industries, for example, computers, mobile phones, portable digital assistants (PDA), digital cameras, game machines, navigation systems and the like. Memory devices constructing the memory system may be roughly divided into volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM) and flash memory.

As an example of the memory devices, the memory devices using a resistance material may include a PRAM, a MRAM, a RRAM and the like. While a DRAM or a flash memory device stores data using a charge, the memory device using a resistance material stores data using a state change of a phase change material such as chalcogenide alloy (PRAM), a resistance change of a magnetic tunnel junction (MJT) thin film depending on a magnetization state of a ferromagnetic substance (MRAM), or a resistance change of a variable resistance material (RRAM).

Since the memory device using a resistance material can randomly access data while exhibiting a nonvolatile characteristic, the memory device is applicable to various memory systems and electronic devices. Hereafter, an operation of the memory device using a resistance material will be described. In the following descriptions, the PRAM will be exemplified as a representative example.

A unit memory cell of the PRAM includes one cell transistor coupled to a word line and one variable resistor coupled to a bit line. The variable resistor is formed of a phase change material, for example, a special thin-film material referred to as a chalcogenide alloy. The PRAM stores data using a state change of a phase change material, depending on a current applied to a memory cell. That is, the phase change material may change to a crystalline phase or amorphous phase depending on the current flowing through the memory cell. The memory cell may store data based on a difference in resistance between the crystalline phase and the amorphous phase.

FIGS. 1A and 1B are diagrams for describing a write operation of the PRAM. FIGS. 1A and 1B illustrate a write operation of storing data in one memory cell of the PRAM.

When a low current equal to or less than a threshold value flows through a memory cell 100 including a phase change resistance element as illustrated in FIG. 1A, the phase change resistance element has a temperature suitable for crystallization. Thus, the memory cell 100 becomes a low-resistance material while being converted into the crystalline phase.

On the other hand, when a high current more than the threshold value flows through the memory cell 100 as illustrated in FIG. 1B, the temperature of the phase change resistance element rises over a melting point. Thus, the memory cell 100 becomes a high-resistance material while being converted into the amorphous phase.

As such, the memory cell 100 constituting the PRAM has two kinds of states, that is, the crystalline state and the amorphous state, depending on a write operation. Since the crystalline phase has relatively low resistance, the crystalline phase may indicate a logical value '0' of data (Logical 0). On the other hand, since the amorphous phase has relatively high resistance, the amorphous phase may indicate a logical value '1' of data (Logical 1). At this time, a write operation of changing the data of the memory cell 100 to the logical value '1' from the logical value '0' may be referred to as a reset operation. A write operation of changing the data of the memory cell 100 to the logical value '0' from the logical value '1' may be referred to as a set operation.

FIG. 2 is a graph illustrating current pulses for write and read operations of the PRAM illustrated in FIGS. 1A and 1B.

As described above, the write operation may include the reset operation and the set operation. Since both the reset operation and the set operation are operations for writing data to a memory cell, the reset operation and the set operation can change the state of the phase change material. Therefore, as illustrated in FIG. 2, the reset operation and the set operation may require a large amount of current while latency is lengthened (refer to RESET and SET pulses). On the other hand, the read operation is an operation for sensing only the current state of the phase change material. Therefore, the read operation can read a value through a low current with low latency (refer to READ pulse).

Therefore, during the write operation performed on the PRAM, a relatively large amount of current flows through the phase change material, and the state of the phase change material continuously changes, as compared with the read operation. As a result, the memory cell of the PRAM may be worn depending on the number of write operations. The number of write operations of the PRAM may be limited. For example, a maximum of hundred thousand write operations can be performed per a memory cell of the PRAM. That is, when data are written hundred thousand times to one memory cell, the memory cell may not be used any more.

Besides, as illustrated in FIG. 2, the endurance of the PRAM can be further reduced by the reset pulse having a larger magnitude than the set pulse, even though the reset operation and the set operation are write operations. That is, although an equal number of write operations are performed, the characteristic of a memory cell in which the reset operation has been performed a larger number of times than the set operation may be further degraded. Therefore, there is a demand for a method capable of efficiently managing the set and reset operations as well as the write operation, to stably maintain the lifetime of the PRAM.

SUMMARY

Various embodiments are directed to a memory system capable of managing the durability of a memory device by writing data to the memory device in consideration of the patterns or types, and an operation method thereof.

In accordance with an embodiment of the present invention, a memory system includes: a memory device comprising first to Nth memory regions, wherein N is a natural number equal to or more than 2; and a memory controller suitable for checking numbers of first logic level data which are contained in first to Nth data groups to be written to the memory device, respectively, and writing the first to Nth data groups to the first to Nth memory regions in order based on the checked numbers.

In accordance with another embodiment of the present invention, an operation method for a memory system includes: checking numbers of first logic level data which are contained in first to Nth data groups to be written to a memory device, respectively, wherein N is a natural number equal to or more than 2; and writing the first to Nth data groups to first to Nth memory regions of the memory device in order, based on the checked numbers.

In accordance with further embodiment of the present invention, a memory system includes: a memory device comprising plural memory regions; and a memory controller suitable for receiving entered data comprising plural data groups, counting how many first logic level data are included in each data group, and assigning each memory region to each data group based on counted number of each data group.

DETAILED DESCRIPTION

Figure 1A:
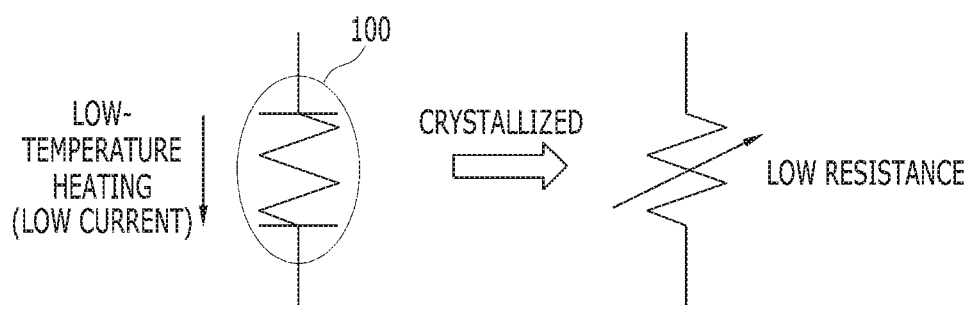
FIGS. 1A and 1B are diagrams for describing a write operation of a PRAM.
Figure 1B:
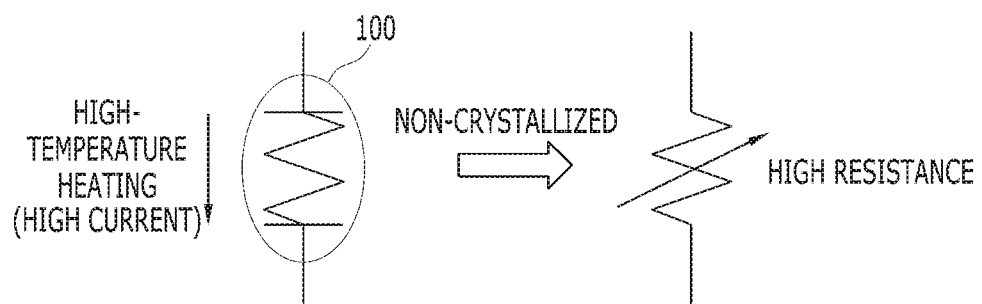
Figure 2:
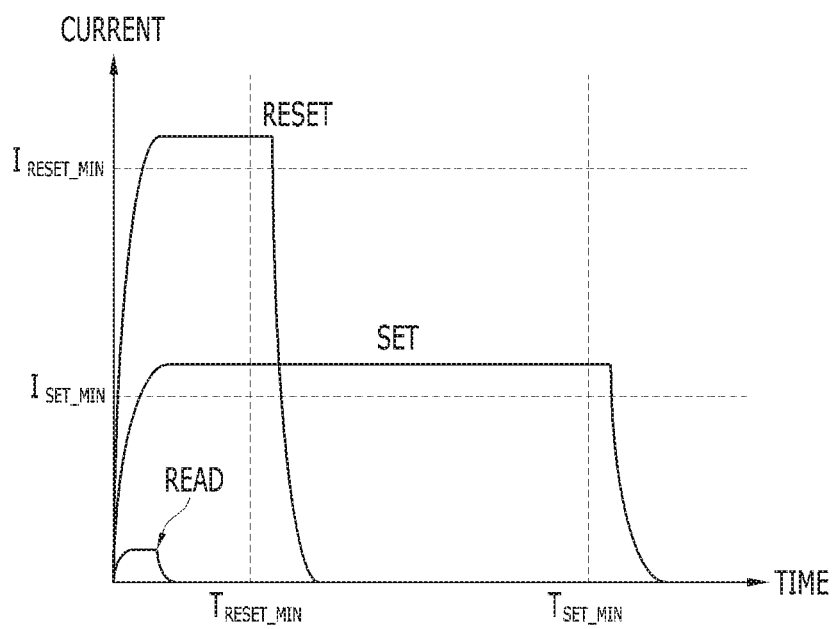
FIG. 2 is a graph illustrating current pulses for write and read operations of the PRAM illustrated in FIGS. 1A and 1B.

Various embodiments will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. Throughout the disclosure, like reference numerals refer to like parts throughout the various figures and embodiments of the invention.

Figure 3:
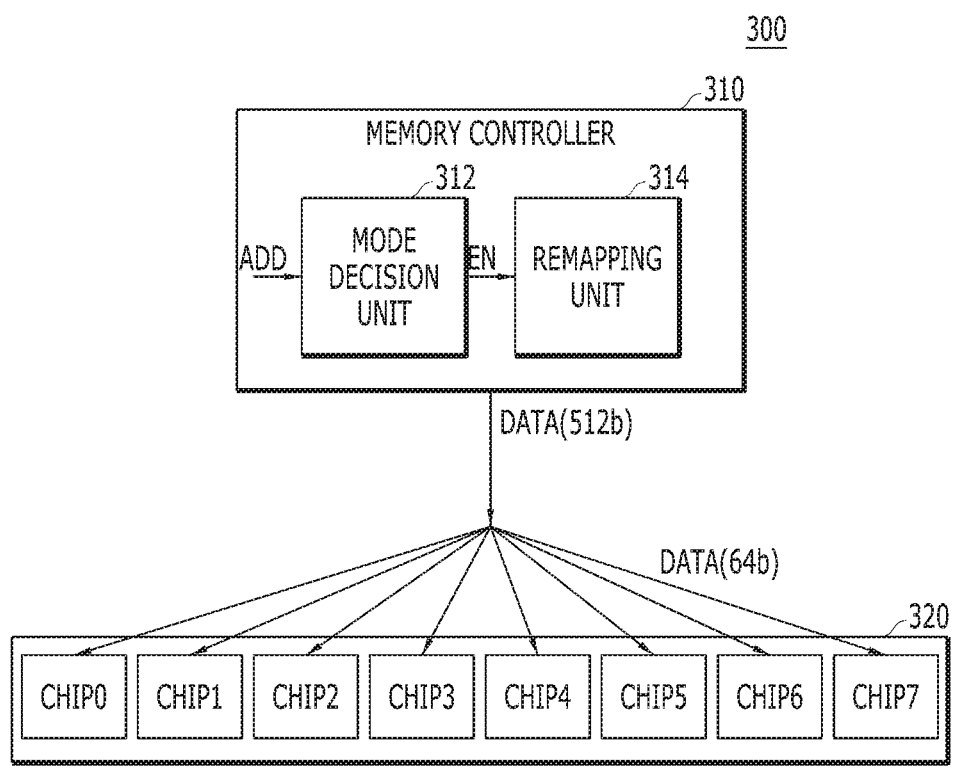
FIG. 3 is a block diagram illustrating a memory system in accordance with an embodiment.

FIG. 3 is a block diagram illustrating a memory system 300 in accordance with an embodiment. Referring to FIG. 3, the memory system 300 may include a memory controller 310 and a memory device 320.

The memory device 320 may include a memory module having a plurality of memory regions, for example, a plurality of memory chips. That is, the memory device 320 may include first to Nth memory regions where N is a natural number equal to or more than 2, and FIG. 3 illustrates that the memory device 320 includes first to eighth memory chips CHIP0 to CHIP7.

The memory controller 310 may write/read data on a basis of the plurality of memory regions of the memory device 320. Therefore, the memory controller 310 may write/read first to Nth data groups corresponding to the first to Nth memory regions to/from the memory device 320. In general, the memory controller 310 may write/read 512-bit data groups DATA(512b) to/from the memory device 320. When the memory device 320 includes first to eighth memory chips CHIP0 to CHIP7, each of the memory chips CHIP0 to CHIP7 may store one 64-bit data group DATA(64b).

The memory controller 310 may allocate the first to Nth data groups DATA(64b) to the respective memory chips CHIP0 to CHIP7, to perform a write operation. The memory controller 310 may manage mapping information by separately storing the mapping information in a parity region (not illustrated) of the memory device 320, the mapping information indicating the relation between the data groups DATA(64b) and the memory chips CHIP0 to CHIP7.

In accordance with an embodiment, the memory controller 310 may include a mode decision unit 312 and a remapping unit 314. The mode decision unit 312 may determine an operation mode based on an address ADD corresponding to the data groups DATA(512b) or address information. The remapping unit 314 may selectively perform a remapping operation according to the operation mode determined by the mode decision unit 312.

That is, when the remapping unit 314 performs a remapping operation according to the operation mode decided by the mode decision unit 312, the memory controller 310 may check the numbers of data having a first logical level (logical value '1'), included in the first to Nth data groups DATA(64b), respectively, and write the data groups DATA(64b) to the first to Nth memory regions in order based on the checked data numbers. On the other hand, when the remapping unit 314 does not perform a remapping operation according to the operation mode decided by the mode decision unit 312, the memory controller 310 may write the data groups DATA(64b) to the first to N-th memory regions regardless of the number of data having the first logical level.

The memory system 300 may receive requests for various types of data from a host. The memory system 300 may store the data in response to the request. By way of example but not limitation, the data may include continuous image data which are not significantly changed depending on an address, and system data which are randomly changed regardless of an address.

When data are not significantly changed, the positions of the first logical level data in the same data group may not be significantly changed, but only the number of the first logical level data may be changed. Therefore, when a write operation is performed only on the changed data, the number of memory cells in which a transition occurs among memory cells corresponding to the data group can be reduced. In this case, when the first to Nth data groups DATA(64b) are remapped depending on the number of first logical level data, the positions of data in data groups having similar numbers of first logical level data may be changed to increase the number of memory cells in which a transition occurs.

On the other hand, when data are randomly changed, the number of memory cells in which a transition occurs can be further reduced in the data groups having similar numbers of first logical level data than in data groups having different numbers of first logical level data. Furthermore, the numbers of set operations and reset operations can be efficiently managed among the data groups having similar numbers of first logical level data. Such a remapping operation will be described in more detail with reference to FIGS. 4A and 4B.

Therefore, the memory controller 310 may determine such a data tendency to selectively perform a remapping operation. To determine a data tendency, the memory controller 310 may use an address ADD or address information. By way of example but not limitation, a host may separately designate an address corresponding to image data and generate address information indicating the designated address, such that the image data can be used by a specific module such as a codec or display. System data such as a boot code may be designated for a low-order address.

The mode decision unit 312 may generate an enable signal EN in response to the address ADD or the address information. The mode decision unit 312 may include an address decoder (not illustrated). For example, when data corresponding to the address ADD is image data, the mode decision unit 312 may deactivate the enable signal EN. On the other hand, when the data corresponding to the address ADD is system data, the mode decision unit 312 may activate the enable signal EN.

The remapping unit 314 may perform a remapping operation in response to the activated enable signal EN. By way of example but not limitation, the remapping unit 314 may perform a remapping operation on data such as system data, which are randomly changed. Therefore, the memory controller 310 in accordance with the embodiment may decide whether to perform data remapping depending on the data tendency.

Figure 4A:
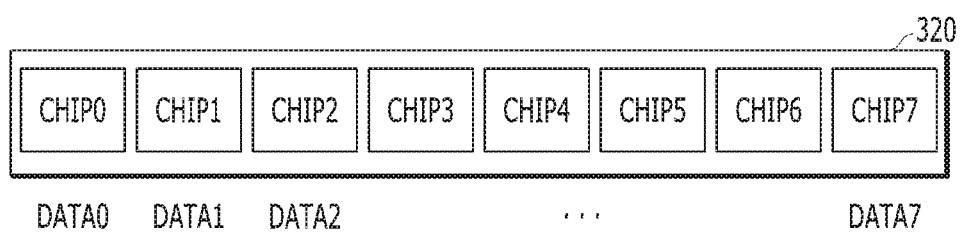
FIGS. 4A and 4B illustrate data groups which are stored in the memory device illustrated in FIG. 3 through a remapping operation.
Figure 4B:
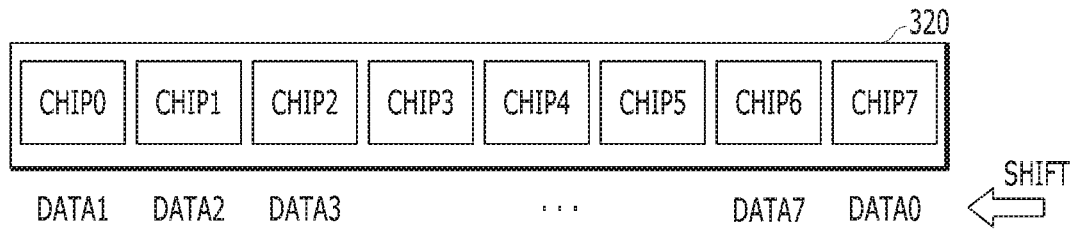

FIGS. 4A and 4B illustrate data groups which are stored in the memory device 320 of FIG. 3 through a remapping operation. FIGS. 4A and 4B illustrate that the memory device 320 includes first to eighth memory chips CHIP0 to CHIP7 as illustrated in FIG. 3 and the number of first to Nth data groups is thus set to eight.

As described above, the remapping unit 314 may check the numbers of first logical level data contained in the respective data groups DATA(64b). The remapping unit 314 may write the data groups DATA(64b) to the first to eighth memory chips CHIP0 to CHIP7 in order based on the checked data numbers. The data groups DATA(64b) may be written in ascending or descending order of the checked data numbers. FIG. 4A illustrates that the first to eighth data groups DATA0 to DATA8 are arranged in ascending order of the checked data numbers, which are written to the first to eighth memory chips CHIP0 to CHIP7, respectively.

Whenever a write operation is performed, the remapping unit 314 may check the numbers of first logical level data contained in the respective data groups DATA(64b). The remapping unit 314 may classify the data groups DATA (64b) into the first to eighth data groups DATA0 to DATA7 according to the checked data numbers. The remapping unit 314 may write the first to the eighth data groups DATA0 to DATA7 to the first to eighth memory chips CHIP0 to CHIP7, respectively. As a result, the eighth data group DATA7 having the largest number of first logical level data may be continuously allocated and written to the eighth memory chip CHIP7. In this case, the reset operation which may further degrade the characteristics of memory cells may be concentrated on the eighth memory chip CHIP7.

In accordance with the embodiment, the reset operation may be concentrated on the eighth memory chip CHIP7, while the reset operation is randomly performed on the first to eighth memory chips CHIP0 to CHIP7 in the related art. Therefore, it is possible to avoid a lifetime decrease of the memory cells included in the other memory chips CHIP0 to CHIP6. Instead, when the rest operation is performed by the number of times (first threshold value) which may degrade the characteristics of the memory cells while the lifetimes of the memory cells included in the eighth memory chip CHIP7 are reduced, the eighth memory chip CHIP7 may be repaired.

Although not illustrated in FIG. 4A, the memory device 320 may include a spare memory region or a spare memory chip. Based on the checked numbers of first logical level data, the remapping unit 314 may count the number of first logical level data written to the first to eighth memory chips CHIP0 to CHIP7, that is, the number of reset operations performed on the first to eighth memory chips CHIP0 to CHIP7. When the counted data number becomes equal to or more than the first threshold value, the memory controller 310 may repair the eighth memory chip CHIP7 with the spare memory chip.

However, the memory device 320 may not include the spare memory chip, or the spare memory chip included in the memory device 320 might have been already used to repair another memory chip. In this case, a remapping operation for using redundancy regions included in the memory chips CHIP0 to CHIP7 may be performed as illustrated in FIG. 4B.

As described with reference to FIG. 4A, the remapping unit 314 may first check the numbers of first logical level data contained in the respective data groups DATA(64b). The remapping unit 314 may classify the data groups DATA(64b) into the first to eighth data groups DATA0 to DATA7 according to the checked data numbers. The remapping unit 314 may write the first to the eighth data groups DATA0 to DATA7 to the first to eighth memory chips CHIP0 to CHIP7, respectively. The remapping unit 314 may count the number of first logical level data written to the first to eighth memory chips CHIP0 to CHIP7, based on the checked numbers of first logical level data.

When the counted data number is equal to or more than a second threshold value smaller than the first threshold value, the remapping unit 314 may shift the order based on the checked data numbers one by one and write the data groups DATA0 to DATA7 to the first to eighth memory chips CHIP0 to CHIP7. FIG. 4B shows that the first to eighth data groups DATA0 to DATA7 which are classified in ascending order of the checked data numbers may be shifted one by one, such that the second to eighth data groups DATA1 to DATA7 and the first data group DATA0 are written to the first to eighth memory chips CHIP0 to CHIP7, respectively.

FIG. 4B illustrates that the counted data number of the eighth memory chip CHIP7 becomes equal to, or more than, the second threshold value. The counted data number of the eighth memory chip CHIP7 may be equal to, or more than, the second threshold value. The counted data numbers of the seventh memory chips CHIP6 to the first memory chip CHIP0 may sequentially reach the second threshold value. The first to eighth data groups DATA0 to DATA7 may be shifted one by one in the arrow direction and written to the first to eighth memory chips CHIP0 to CHIP7.

When the spare memory chip of the memory device 320 cannot be used, a memory chip itself cannot be repaired. Therefore, the reset operations may be preferably distributed to the plurality of memory chips CHIP0 to CHIP7 rather than concentrated on one memory chip CHIP7. In this case, each of the memory chips CHIP0 to CHIP7 may repair a deteriorated memory cell with a redundancy cell included therein.

In accordance with the embodiment, the reset operations may be distributed and performed on the first to eighth memory chips CHIP0 to CHIP7 as much as possible, while the reset operations are randomly performed on the first to eighth memory chips CHIP0 to CHIP7 in the related art. Therefore, the lifetimes of the memory cells included in the memory chips CHIP0 to CHIP7 may be reduced to similar levels.

Figure 5:
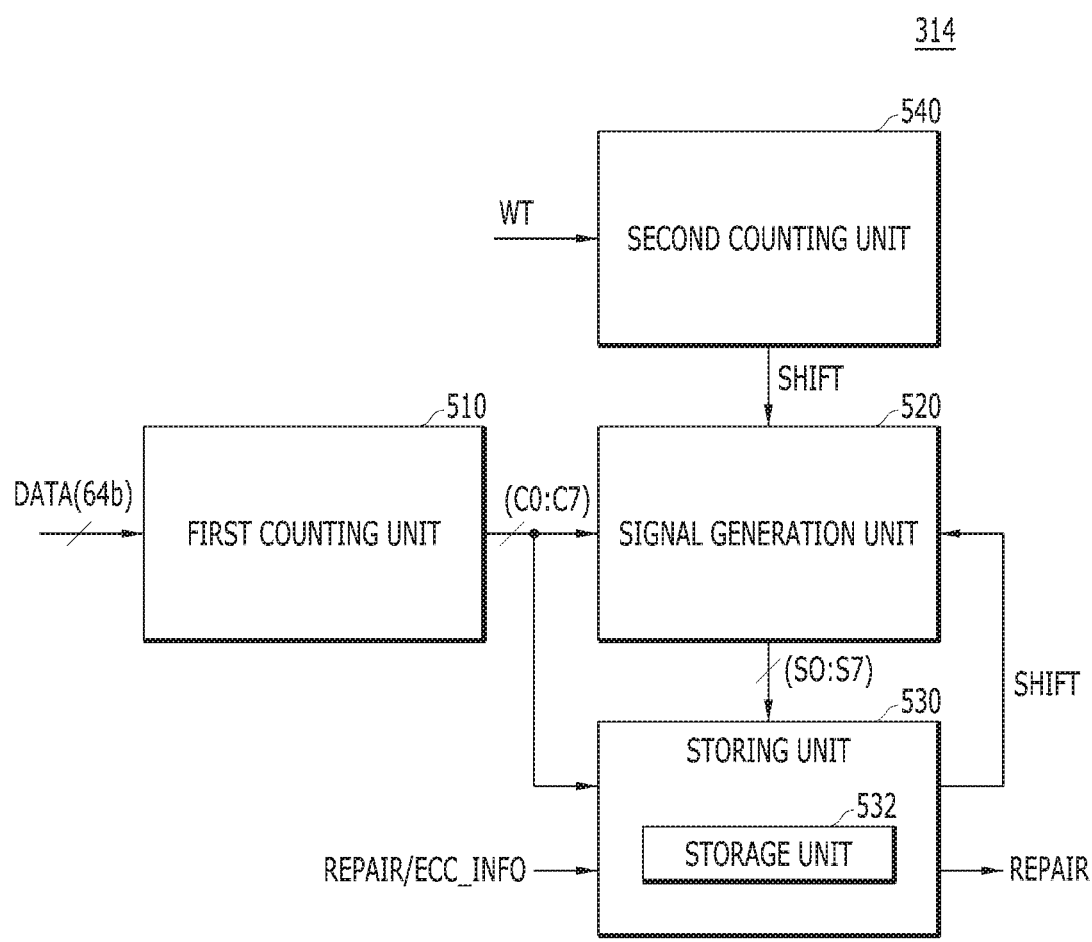
FIG. 5 is a block diagram illustrating a remapping unit of FIG. 3.

FIG. 5 is a block diagram illustrating the remapping unit 314 of FIG. 3. Referring to FIG. 5, the remapping unit 314 may include a first counting unit 510, a signal generation unit 520, a storing unit 530, and a second counting unit 540. The remapping unit 314, the first counting unit 510, the signal generation unit 520, the storing unit 530 and the second counting unit 540 may include all circuits, systems or devices necessary for their respective operations and functions.

The first counting unit 510 may generate count values C0:C7 by counting the numbers of first logical level data contained in the respective data groups DATA(64b). Whenever a write operation is performed, the first counting unit 510 may receive the data groups DATA(64b) and generate the count values C0:C7.

The signal generation unit 520 may generate first to eighth select signals S0:S7 indicating the count values C0:C7 in ascending order. By way of example but not limitation, when the count values C0:C7 are 28, 32, 16, 24, 20, 36, 40 and 48 respectively, the signal generation unit 520 may generate first to eighth select signals S3, S4, S0, S2, S1, S5, S6, S7 which are sequentially matched with the counted values C0:C7. That is, the first to eighth select signals S0 to S7 from the first select signal S0, corresponding to the smallest count value of 16, to the eighth select signal S7, corresponding to the largest count value of 48, may be determined and generated in response to the count values C0:C7.

The storing unit 530 may include first to eighth storage units 532. The first to eighth storage units 532 may select, and store, the count values C0:C7 in response to the first to eighth signals S0:S7, respectively. In the above-described example, the first storage unit 532 may store the corresponding count value C2 of 16 in response to the first select signal S0. The eighth storage unit 532 may store the corresponding count value C7 of 48 in response to the eighth select signal S7. Therefore, the first to eighth storage units 532 may store the count values of 16, 20, 24, 28, 32, 36, 40 and 48, respectively.

Whenever a write operation is performed, each of the first to eighth storage units 532 may store the selected count value by adding the selected count value to a count value stored therein. That is, the first to eighth storage units 532 may continuously add and store the count values corresponding to the first to eighth select signals S0:S7.

In accordance with the present embodiment, the storing unit 530 may receive repair information REPAIR_INFO. The repair information REPAIR_INFO may include built-in-redundancy-analysis (BIRA) information or built-in-self-redundancy (BISR) information. At this time, the BIRA information may include information obtained by analyzing the positions of redundancy memory cells in the memory device 320 or the unit of a repair operation. The BISR information may include information on a defective memory cell replaced with a redundancy memory cell based on the BIRA.

The repair information REPAIR_INFO may be inputted to the memory controller 310 from the memory device 320. The repair information REPAIR_INFO may indicate at least one of whether a spare memory chip is included in the memory device 320 or whether a spare memory chip included in the memory device 320 is available. Therefore, the memory controller 310 may decide whether to concentrate the reset operations on one memory chip or distribute the reset operations to a plurality of memory chips, based on the repair information REPAIR_INFO.

In accordance with another embodiment, the storing unit 530 may receive error correction code (ECC) information ECC_INFO. The ECC information ECC_INFO may indicate the performance of an ECC operation performed by the memory controller 310. By way of example but not limitation, the ECC information ECC_INFO may indicate how many bits of error can be detected or corrected in the data groups DATA(512b). Furthermore, the ECC information ECC_INFO may indicate whether to apply a chip-kill algorithm. When the chip-kill algorithm is applied, whole data of one memory chip may be recovered, regardless of error bits which can be detected and corrected through the ECC operation. Therefore, the memory controller 310 may decide whether to concentrate reset operations on one memory chip or whether to distribute reset operations on a plurality of memory chips, based on the ECC information ECC_INFO.

Based on the repair/ECC information REPAIR/ECC_INFO, the storing unit 530 may generate a repair signal REPAIR when the values stored in the first to eighth storage units 532 are equal to or more than the first threshold value. Furthermore, based on the repair/ECC information REPAIR/ECC_INFO, the storing unit 530 may generate a shift signal SHIFT when the values stored in the first to eighth storage units 532 are equal to, or more than, the second threshold value smaller than the first threshold value.

For example, when one memory cell of the memory device 320 can be worn out when 16K reset pulses are applied, the first threshold value may be set to 16K. At this time, the second threshold value may be set to 2K (16K/8). That is, the second threshold value may be set by dividing the first threshold value by the number of times that the reset operations are distributed and performed on the whole memory regions.

When the repair signal REPAIR is generated, the memory controller 310 may repair the eighth memory chip CHIP7 with a spare memory chip like the remapping operation of FIG. 4A. That is, when a spare memory chip remains in the memory device 320, the memory controller 310 may intensively write first logical level data to one memory chip to collect defective memory cells into the one memory chip. The memory controller 310 may repair the intensively written memory chip with the spare memory chip.

When the shift signal SHIF is generated, the signal generation unit 520 may shift the first to eighth select signals S0:S7 indicating the count values C0:C7 one by one. That is, the signal generation unit 520 may generate the eighth select signal S7 and the first to seventh select signals S0:S6 in ascending order of the count values C0:C7. In the above-described example, when the count values C0:C7 are 28, 32, 16, 24, 20, 36, 40 and 48, the signal generation unit 520 may generate the first to eighth select signals S2, S3, S7, S1, S0, S4, S5 and S6, each corresponding to each count value. Thus, the first storage unit 532 may store the count value C4 of 20 in response to the first select signal S0, and the eighth storage unit 532 may store the count value C3 of 16 in response to the eighth select signal S7.

As a result, the first storage unit 532 may store the second smallest count value after having stored the smallest count value. On the other hand, the eighth storage unit 532 may store the smallest count value after having stored the largest count value. This operation indicates that the eighth memory chip CHIP7 having stored the eighth data group DATA7 is shifted to store the first data group DATA0 during the remapping operation of FIG. 4B. Therefore, when the number of reset operations becomes equal to or more than the second threshold value while the reset operations are concentrated on the eighth memory chip CHIP7, the smallest number of reset operations may be performed on the eighth memory chip CHIP7. Similarly, whenever the number of reset operations performed on each of the memory chips CHIP0 to CHIP7 are continuously counted and becomes equal to or more than the second threshold value, the memory chip on which the reset operations are concentrated may be shifted by one. Thus, the lifetimes of the memory chips CHIP0 to CHIP7 may be uniformly increased.

In accordance with another embodiment, the remapping unit 314 may further include a second counting unit 540. The second counting unit 540 may count the number of times that the data groups DATA(64b) are written to the first to Nth memory regions, that is, the first memory to eighth memory chips CHIP0 to CHIP7.

Referring to the remapping operation of FIG. 4A, the data groups DATA0 and DATA7 having a relatively large number of first logical level data or second logical level data (logical value '0') can reduce the number of memory cells in which a transition occurs due to a write operation, compared to the data groups DATA3 and DATA4 having a similar number of first logical level data or second logical level data. By way of example but not limitation, when the number of first logical level data in the first data group DATA0 is around 1, the number of memory cells in which a transition occurs in the first memory chip CHIP0 may range from 2 to 3. Similarly, since the eighth data group DATA7 has a small number of second logical level data, the memory chip CHIP7 may have a small number of memory cells in which a transition occurs.

On the other hand, the fourth and fifth memory chips CHIP3, CHIP4, in which the number of first or second logical level data corresponds to the intermediate level, may have a relatively large number of memory cells in which a transition occurs. By way of example but not limitation, when the number of first logical level data contained in the fourth data group DATA3 is around 30, a transition may occur in a maximum of 64 memory cells of the fourth memory chip CHIP3.

Therefore, since the wear-out of the fourth and fifth memory chips CHIP3, CHIP4 corresponding to the intermediate level increases, the reset operations may be distributed based on the number of write operations. The distribution period may be set to a value obtained by dividing the number of write operations to wear out one memory cell of the memory device 320 by the number of memory chips, on the supposition that a transition occurs in the whole memory cells based on the fourth and fifth memory chips CHIP3, CHIP4.

For this operation, the second counting unit 540 may count the number of write operations in response to a write command WT. When the counted number of write operations becomes equal to, or more than, a third threshold value which is set according to the distribution period, the second counting unit 540 may generate the shift signal SHIFT to provide the shift signal SHIFT to the signal generation unit 520. As described above, the signal generation unit 520 may shift the first to eighth select signals S0:S7 indicating the count values C0:C7 one by one in response to the shift signal SHIFT.

Figure 6:
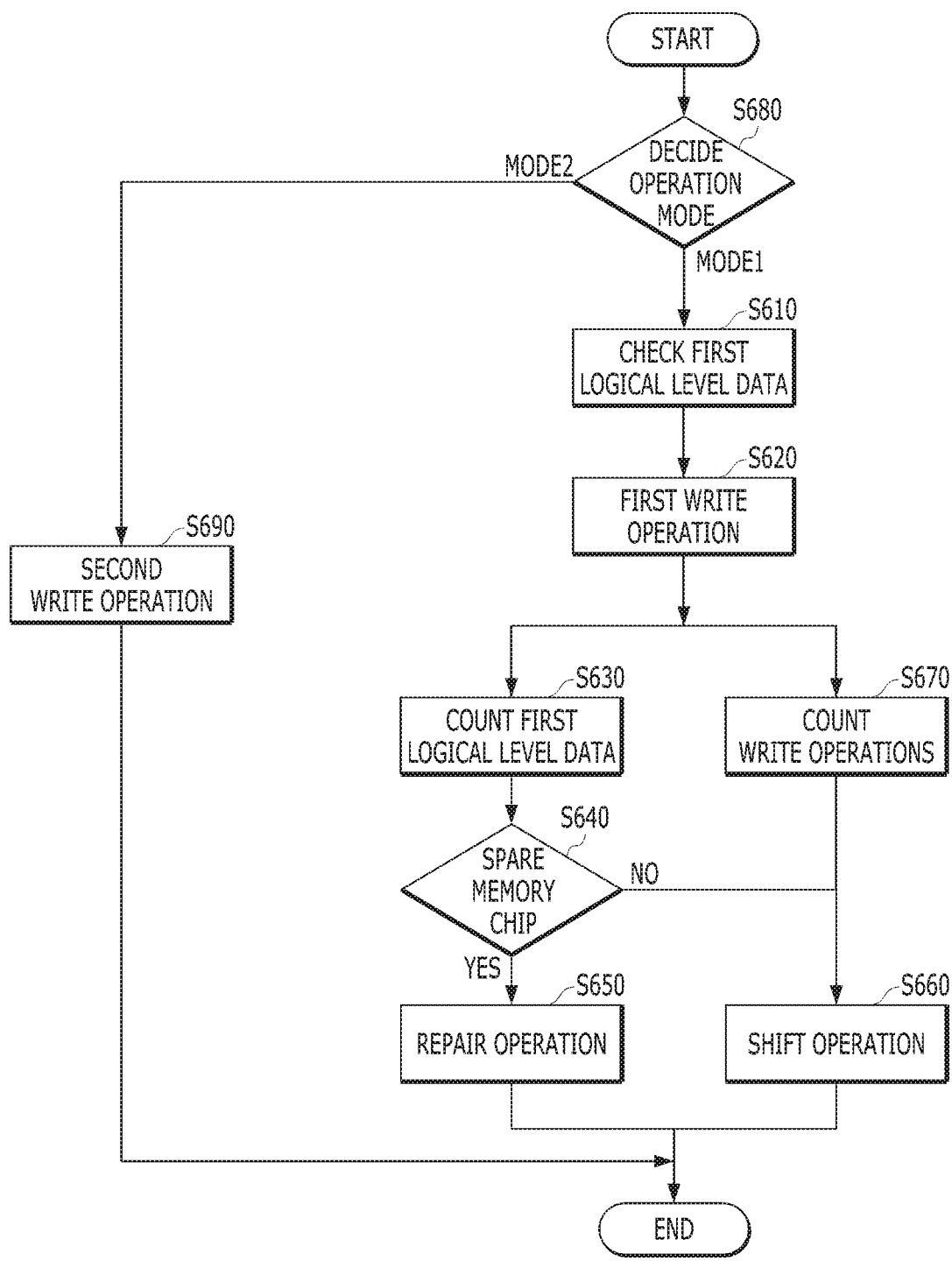
FIG. 6 is a flowchart illustrating an operation of the memory system in accordance with the embodiment.

FIG. 6 is a flowchart illustrating the operation of the memory system 300 in accordance with the embodiment. The operation of the memory system 300 may be based on the supposition that the memory system 300 includes the first to eighth memory chips CHIP0 to CHIP7 as illustrated in FIG. 3.

1) First Logical Level Data Check S610

The memory controller 310 may check the numbers of first logical level data contained in the data groups DATA (64b) written to the memory device 320. Specifically, the first counting unit 510 of the remapping unit 314 may generate the count values C0:C7 by counting the numbers of first logical level data contained in the respective data groups DATA(64b).

2) First Write Operation S620

The memory controller 310 may write the first to eighth groups DATA0 to DATA7 to the first to eighth memory chips CHIP0 to CHIP7 in order based on the checked data numbers. That is, the memory controller 310 may classify the data groups DATA(64b) into the first to eighth data groups DATA0 to DATA7 in order based on the checked data numbers. The memory controller 310 may write the first to eighth data groups DATA0 to DATA7 to the first to eighth memory chips CHIP0 to CHIP7, respectively. For this operation, the signal generation unit 520 of the remapping unit 314 may generate the first to eighth select signals S0:S7 in response to the count values C0:C7. The first to eighth select signals S0:S7 may indicate the count values C0:C7 in ascending order. The memory controller 310 may generate memory chip select signals according to the first to eighth select signals S0:S7. The memory controller 310 may write the first to eighth data groups DATA0 to DATA7 to the first to eighth memory chips CHIP0 to CHIP7.

3) First Logical Level Data Count S630

Based on the checked data numbers, the remapping unit 314 may count the number of first logical level data written to the first to eighth memory chips CHIP0 to CHIP7. The storing unit 530 of the remapping unit 314 may include the first to eighth storage units 532. The storing unit 530 may select and store the corresponding count values C0:C7 in response to the first to eighth signals S0:S7.

4) Spare Memory Chip Check S640

The memory controller 310 may check whether an available spare memory chip remains in the memory device 320 based on the repair information REPAIR. When the check result indicates that the memory device 320 includes a spare memory chip (YES at step S640), the memory controller 310 may additionally perform the repair operation S650, depending on whether the counted data number is equal to, or more than, the first threshold value. That is, the storing unit 530 may output the repair signal REPAIR, when the value stored in the first to eighth storage units 532 is equal to, or more than, the first threshold value. According to the repair signal REPAIR, the memory controller 310 may repair the memory chip on which the reset operations have been concentrated, using the spare memory chip.

When the check result indicates that the memory device 320 includes no spare memory chips (NO at step S640), the memory controller 310 may additionally perform a shift operation S660, depending on whether the counted data number is equal to, or more than, the second threshold value. That is, the storing unit 530 may output the shift signal SHIFT, when the value stored in the first to eighth storage units 532 is equal to, or more than, the second threshold value. The signal generation unit 520 may shift the first to eighth select signals S0:S7 in response to the shift signal SHIFT. As a result, the first to eighth storage units 532 of the storing unit 530 may select, and store, the count values C0:C7 in response to the shifted first to eighth signals S0:S7.

5) Write Operation Count S670

The memory controller 310 may count the number of times that the data groups DATA(64b) are written to the first to eighth memory chips CHIP0 to CHIP7. The memory controller 310 may count the number of write operations. The memory controller 310 may additionally perform the shift operation S660 depending on whether the counted number of write operations is equal to or more than the third threshold value. Specifically, the second counting unit 540 of the remapping unit 314 may perform a counting operation in response to the write command WT. The second counting unit 540 may generate the shift signal SHIFT when the counted number of write operations becomes equal to or more than the third threshold value.

6) Operation Mode Decision S680

The memory controller 310 may additionally check a data tendency to decide the operation mode. That is, the mode decision unit 312 of the memory controller 310 may check whether the data groups DATA(512b) are system image or image data, based on an address ADD corresponding to the data groups DATA(512b). When the data groups DATA(512b) are checked as system data, the mode decision unit 312 may set the first operation mode MODE1 to activate the enable signal EN. The remapping unit 314 may perform a remapping operation in response to the activated enable signal EN.

7) Second Write Operation S690

On the other hand, when the data groups DATA(512b) are checked as image data, the mode decision unit 312 may set the second operation mode MODE1 to deactivate the enable signal EN. When the enable signal EN is deactivated, the memory controller 310 may write the data groups DATA(512b) to the first to eighth memory chips CHIP0 to CHIP7 regardless of the numbers of first logical level data.

In accordance with the embodiment, a memory system may check the logical levels of data, and classify and write the data to a plurality of memory regions of a memory device based on the checked logical levels, the memory device having different influences on memory cells depending on the logical levels of data. Therefore, the memory system can optimize and manage the wear-out levels of the plurality of memory regions included in the memory device. Furthermore, the memory system can distribute or concentrate the wear-out levels depending on a method for repairing memory regions, thereby increasing the durability of the memory device.

Furthermore, the memory system can check whether data are randomly changed to select a write operation method based on the check result. Therefore, the memory system can minimize the number of memory cells in which a transition occurs during a write operation. The memory system can avoid the power consumption or the lifetime reduction of the memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device comprising first to Nth memory regions, wherein N is a natural number equal to or more than 2; and
   a memory controller suitable for counting first numbers of first logic level data which are contained in first to Nth data groups to be written to the memory device, respectively, and writing the first to Nth data groups to the first to Nth memory regions in order of the first counted numbers.

2. The memory system of claim 1, wherein the memory controller counts second numbers of the first logic level data which are written to the first to Nth memory regions, respectively, based on the first counted numbers.

3. The memory system of claim 2, wherein when the memory device includes a spare memory region, the memory controller repairs a memory region corresponding to the second counted number equal to or more than a first threshold value, among the memory regions, with the spare memory region.

4. The memory system of claim 2, wherein when the memory device includes no spare memory region and at least one of the second counted numbers is equal to or more than a second threshold value, the memory controller shifts the order of the first to Nth data groups based on the first counted numbers one by one, and writes the first to Nth data groups to the first to Nth memory regions in the shifted order.

5. The memory system of claim 1, wherein the memory controller comprises:
   a first counting unit suitable for generating count values by counting the first numbers of first logic level data which are contained in the respective data groups;
   a signal generation unit suitable for generating first to Nth select signals in response to the count values, the first to Nth select signals indicating the count values in ascending order; and
   a storing unit having first to Nth storage units suitable for selecting and storing the corresponding count values in response to the first to Nth select signals, respectively.

6. The memory system of claim 5, wherein according to repair information or error correction code (ECC) information, the storing unit generates a repair signal when the values stored in the first to Nth storage units are equal to or more than a first threshold value, or generates a shift signal when the values stored in the first to Nth storage units are equal to or more than a second threshold value smaller than the first threshold value.

7. The memory system of claim 6, wherein the signal generation unit shifts the first to Nth select signals in response to the shift signal.

8. The memory system of claim 5, wherein the memory controller further comprises:
   a second counting unit suitable for counting a third number of writing the data groups to the first to Nth memory regions.

9. The memory system of claim 8, wherein when the third counted number is equal to or more than a third threshold value, the second counting unit generates a shift signal and outputs the shift signal to the signal generation unit.

10. The memory system of claim 1, wherein the memory controller comprises a mode decision unit suitable for determining an operation mode based on an address corresponding to the data groups.

11. The memory system of claim 10, wherein according to the operation mode determined by the mode decision unit, the memory controller writes the data groups to the first to Nth memory regions regardless of the numbers of first logic level data.

12. An operation method for a memory system, comprising:
   counting first numbers of first logic level data which are contained in first to Nth data groups to be written to a memory device, respectively, wherein N is a natural number equal to or more than 2; and writing the first to Nth data groups to first to Nth memory regions of the memory device in order of the first counted numbers.

13. The operation method of claim 12, further comprising:

counting second numbers of the first logic level data which are written to the first to Nth memory regions, respectively, based on the first counted numbers; and checking whether the memory device includes a spare memory region, based on repair information.

14. The operation method of claim 13, further comprising:

repairing a memory region corresponding to the second counted number equal to or more than a first threshold value, among the memory regions, with the spare memory region, when the result of the checking indicates that the memory device includes the spare memory region.

15. The operation method of claim 13, further comprising:

shifting the order of the first to Nth data groups based on the first counted numbers one by one, when the result of the checking indicates that the memory device includes no spare memory region and at least one of the second counted numbers is equal to or more than a second threshold value.

16. The operation method of claim 12, further comprising:

counting a third number of writing the data groups to the first to Nth memory regions of the memory device.

17. The operation method of claim 16, further comprising:

shifting the order of the first to Nth data groups based on the first counted numbers one by one, when the third counted number is equal to or more than a third threshold value.

18. The operation method of claim 12, further comprising:

determining an operation mode based on an address corresponding to the data groups.

19. The operation method of claim 18, wherein the determining of the operation mode comprises checking whether the data groups are system data or image data, based on the address.

20. The operation method of claim 19, wherein when the data groups are checked as the image data, the data groups are written to the first to Nth memory regions regardless of the numbers of first logic level data.

21. A memory system comprising:

a memory device comprising plural memory regions; and a memory controller suitable for receiving entered data comprising plural data groups, counting how many first logic level data are included in each data group, and assigning each memory region to each data group in order of counted number of each data group.

22. The memory system of claim 21, wherein the memory controller counts how many first logic level data are written in each memory region based on the counted number of each data group.

23. The memory system of claim 22, wherein when the counted number of each memory regions is equal to or more than a threshold value, the memory controller shifts an order of assigning each memory regions to each data group one by one.

* * * * *